(12) United States Patent
Sou (10) Patent No.: US 11,942,944 B2
(45) Date of Patent: Mar. 26, 2024

(54) OSCILLATOR WITH IMPROVED FREQUENCY STABILITY

(71) Applicant: PRAGMATIC PRINTING LTD., Sedgefield (GB)

(72) Inventor: Anthony Sou, Sedgefield (GB)

(73) Assignee: PRAGMATIC PRINTING LTD., Sedgefield (GB)

( * ) Notice: Subject to any disclaimer, the term of this patent is extended or adjusted under 35 U.S.C. 154(b) by 0 days.

(21) Appl. No.: 17/603,062

(22) PCT Filed: Apr. 22, 2020

(86) PCT No.: PCT/GB2020/051001
§ 371 (c)(1),
(2) Date: Oct. 12, 2021

(87) PCT Pub. No.: WO2020/217055
PCT Pub. Date: Oct. 29, 2020

(65) Prior Publication Data
US 2022/0182045 A1 Jun. 9, 2022

(30) Foreign Application Priority Data
Apr. 24, 2019 (GB) ..................................... 1905729

(51) Int. Cl.
*H03K 3/03* (2006.01)
*H03K 5/01* (2006.01)
*H03K 5/00* (2006.01)

(52) U.S. Cl.
CPC ............. *H03K 3/0315* (2013.01); *H03K 5/01* (2013.01); *H03K 2005/00078* (2013.01)

(58) Field of Classification Search
CPC ..................................................... H03K 3/0315
(Continued)

(56) References Cited

U.S. PATENT DOCUMENTS

| 4,105,950 A | 8/1978 | Dingwall |
| 6,686,806 B2 | 2/2004 | Dufour |

(Continued)

FOREIGN PATENT DOCUMENTS

| CN | 107017844 A | 8/2017 |
| EP | 0634837 A2 | 1/1995 |
| JP | 2008-252414 A | 10/2008 |

OTHER PUBLICATIONS

International Search Report for International Application No. PCT/GB2020/051001, dated Jul. 17, 2020.

(Continued)

*Primary Examiner* — Joseph Chang
(74) *Attorney, Agent, or Firm* — Jason H. Vick; Sheridan Ross, PC (57) ABSTRACT

There is provided an oscillator, having an input terminal (In) and an output terminal (Out), comprising a first signal delay circuit (104a-d), having a first voltage response characteristic, configured to provide a predetermined first propagation delay; a second signal delay circuit (104e, 108, 110), having a second voltage response characteristic that is inversely correlated to said first voltage response characteristic, operatively coupled with said first signal delay circuit and configured to provide a predetermined second propagation delay, and wherein said predetermined first propagation delay and said predetermined second propagation delay are temporally matched, so as to generate an oscillating output signal (Out) of a predetermined frequency.

8 Claims, 6 Drawing Sheets

(58) Field of Classification Search
USPC .......................................................... 331/57
See application file for complete search history.

(56) References Cited

U.S. PATENT DOCUMENTS

| | | |
|---|---|---|
| 2006/0109060 A1 | 5/2006 | Nishi et al. |
| 2006/0181359 A1 | 8/2006 | Park et al. |
| 2010/0033260 A1 | 2/2010 | Sakaguchi |
| 2013/0154749 A1 | 6/2013 | Chen |
| 2014/0327486 A1 | 11/2014 | Roine et al. |
| 2016/0164459 A1 | 6/2016 | Kim |
| 2017/0257065 A1 | 9/2017 | Wang et al. |

OTHER PUBLICATIONS

Written Opinion for International Application No. PCT/GB2020/051001, dated Jul. 17, 2020.
Search Report Under Section 17(5) for corresponding Great Britain Application No. GB 1905729.8, dated Sep. 25, 2019.
International Preliminary Report on Patentability for International Application No. PCT/GB2020/051001, dated Nov. 4, 2021.
Jovanović, G. et al. "A CMOS Voltage Controlled Ring Oscillator with Improved Frequency Stability" Scientific Publications of the State University of Novi Pazar; Ser. A: Appl. Math. Inform. and Mech. vol. 2, 1; 2010.
Sun, Jun et al. "A Low Power Low Supply Sensitivity Current-Mode Relaxation Oscillator" IEICI Electronics Express, vol. 11, No. 23; 2014.
Zhu, Junheng et al. "A 45-75 MHz 197-452µW Oscillator with 164.6dB FoM and 2.3$ps_{nms}$ Period Jitter in 65nm CMOS" IEEE Custom Integrated Circuits Conference (CICC); 2017.

OSCILLATOR WITH IMPROVED FREQUENCY STABILITY

CROSS-REFERENCE TO RELATED APPLICATIONS

This application is a national stage application under 35 U.S.C. 371 of PCT Application No. PCT/GB2020/051001 having an international filing date of 22 Apr. 2020, which designated the United States, which PCT application claimed the benefit of Great Britain Application No. 1905729.8, filed 24 Apr. 2019, each of which are incorporated herein by reference in their entirety.

The present invention generally relates to electronic circuits, and in particular to oscillators suitable for ultra-low-cost flexible integrated circuits (IC). Even more particularly, the present invention relates to an oscillator with improved frequency stability over a range of supply voltage.

INTRODUCTION

An accurate clock generator is a fundamental requirement for ICs (Integrated Circuits), because many electronic circuits require a clock signal to operate properly. Some of the common types of oscillators include crystal oscillators, LC (inductor-resistor) oscillators, RC (resistor-capacitor) oscillators and ring oscillators.

Crystal oscillators, for example, generally have a very stable frequency. However, crystal oscillators require a crystal that is external to the IC chip, therefore, taking on significant space, as well as, increasing the overall complexity and costs. LC oscillators generally require a relatively large area for the inductor on the IC chip and are more appropriate to be used for high frequency applications where a relatively high current is available.

Further, two well-known types of oscillator circuits that are currently used for low-cost ICs are the RC oscillator and the ring oscillator.

Figure 1:
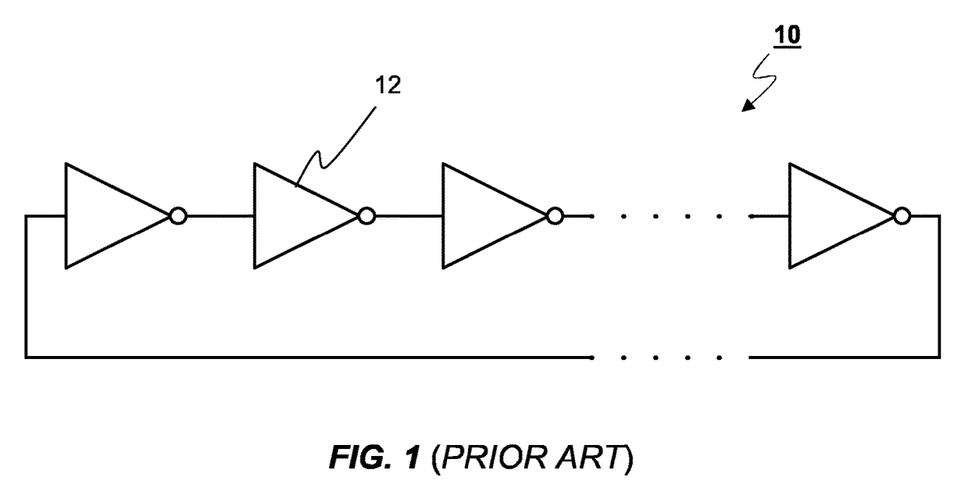
FIG. 1 (Prior Art) is a simplified schematic illustration of a circuit diagram of a typical ring oscillator, including a number of series-coupled inverter stages.

FIG. 1 illustrates a schematic example of a typical ring oscillator 10 comprising a number of inverter stages 12 that are connected in a ring configuration. Here, the oscillation frequency of the circuit is determined by the gate delay (time delay) in the inverter stages 12. The overall gate delay may either be controlled by the current through the gate (e.g. via the supply voltage to each inverter stage), or by the number of gates in the ring oscillator 10. Typically, ring oscillators are comprised of an odd number of inverter stages, as this configuration is inherently unstable, so that oscillation is more likely.

Figure 2:
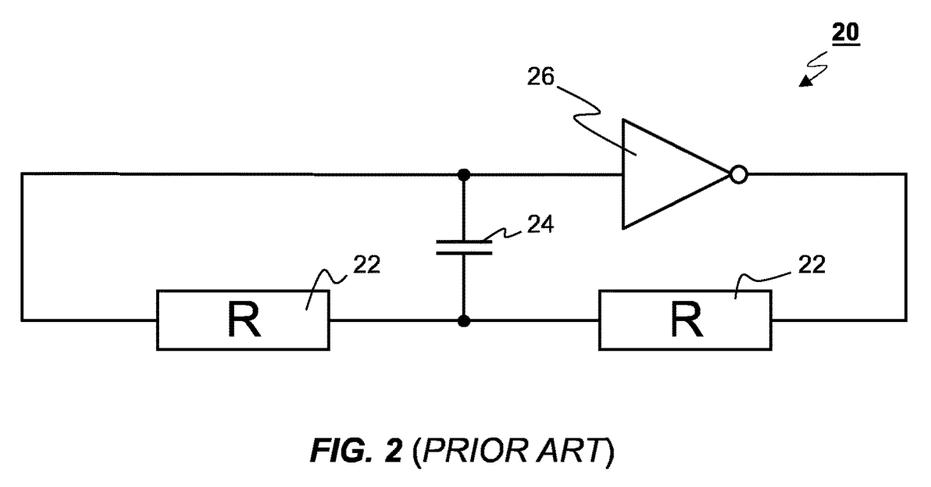
FIG. 2 (Prior Art) shows a simplified schematic illustration of a circuit diagram of a typical RC oscillator, including an RC element operably coupled with an inverter stage.

FIG. 2 illustrates a schematic example of a typical RC oscillator 20 where the resistor 22 and capacitor 24 are connected, so as to generate a time-varying voltage that is provided to one or more inverter stages 26 causing the oscillating clock signal to propagate therethrough. The oscillation frequency is determined primarily by the values of resistor(s) 22 and capacitor 24, whilst the inverter is present to ensure that the circuit oscillates. As with the ring oscillator 10, the oscillating clock signal propagates in accordance with a time delay that is at least partially dependent on the supply voltage.

Figure 3:
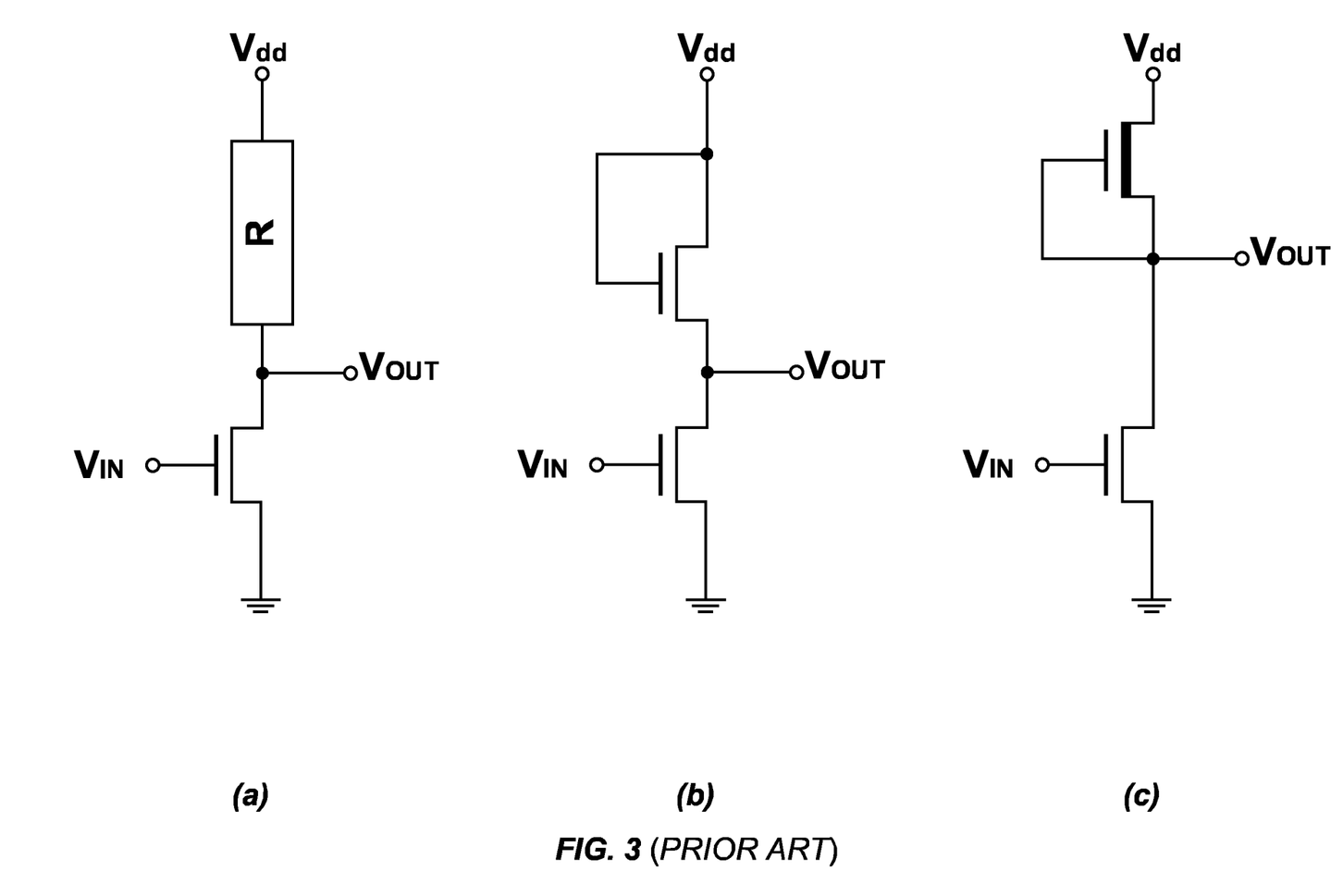
FIG. 3 (Prior Art) shows a simplified schematic illustration of different inverter stage configurations using unipolar transistor(s), such as, (a) an NMOS configuration with a resistor load, (b) an NMOS configuration with enhancement load and (c) an NMOS configuration with depletion load.

There are numerous types of inverter stages by which ring or RC oscillators can be realised. FIGS. 3(a), (b) and (c) illustrates just a few simplified schematics of possible inverter stages utilising NMOS transistors, including, inter alia, (a) an NMOS configuration with a resistor load, (b) an NMOS configuration with enhancement load and (c) an NMOS configuration with depletion load.

All of these inverter stages may be used in flexible IC structures, though, any other inverter design (e.g. using PMOS, CMOS or organic thin-film transistors) may be considered when designing either ring or RC oscillators.

Depending on the IC technology, both, ring oscillators and, to a lesser extent, RC oscillators, generally require a relatively low area within the IC chip and may also be operated with relatively low power levels. However, both suffer from sensitivity of their oscillation frequency to changes in operating voltage, operating temperature or even variations in the manufacturing process. In particular, the presence of significant voltage variations between devices implementing, for example, low-cost flexible IC technology constitutes a real challenge for providing accurate clock generation, in particular for IC applications such as RFID in which the power supply to the chip may be variable.

Accordingly, it is an object of the present invention to provide an improved oscillator that is less sensitive to supply voltage variations at least over a predetermined voltage range.

SUMMARY OF THE INVENTION

Preferred embodiment(s) of the invention seek to overcome one or more of the disadvantages of the prior art.

According to a first embodiment of the present invention, there is provided an oscillator, having an input terminal and an output terminal, comprising:
  a first signal delay circuit, having a first voltage response characteristic, configured to provide a predetermined first propagation delay;
  a second signal delay circuit, having a second voltage response characteristic that is inversely correlated to said first voltage response characteristic, operatively coupled with said first signal delay circuit and configured to provide a predetermined second propagation delay, and wherein said predetermined first propagation delay and said predetermined second propagation delay are temporally matched, so as to generate an oscillating output signal of a predetermined frequency.

This provides the advantage of a considerably improved frequency stability to variations over a specific range of the voltage supply. In particular, the oscillator of the present invention comprises two different operably coupled oscillator stages, wherein one oscillator stage has a voltage related frequency change that is configured to at least partially cancel out the voltage related frequency change of the other one, i.e. the voltage related frequency dependency of one oscillator stage is inverse to that of the other one, so that the output frequency of the oscillator is stable for at least a predetermined range of the varying voltage supply.

Advantageously, the oscillator may further comprise a first supply rail for providing a first supply voltage and a second supply rail for providing a second supply voltage. Preferably, said first signal delay circuit may comprise at least two series-coupled inverter stages between said input terminal and said output terminal, each operatively coupled to said first and second supply rail. Even more preferably, said second signal delay circuit may comprise at least one resistor-capacitor (RC) network operatively coupled with said at least two series-coupled inverter stages of said first signal delay circuit.

Advantageously, the oscillator may further comprise a buffer stage operatively coupled to said output terminal and adapted to provide a predetermined impedance characteristic.

Advantageously, said first signal delay circuit may comprise an odd number of series-coupled inverter stages.

Alternatively, said first signal delay circuit may comprise an even number of series-coupled inverter stages.

Advantageously, each of said at least two series-coupled inverter stages may be configured to optimise said oscillating output signal for a predetermined voltage range of said first and second supply voltage. Preferably, said resistor-capacitor network may be matched to said at least two series-coupled inverter stages, so as to optimise said oscillating output signal for said predetermined voltage range of said first and second supply voltage.

Advantageously, said first signal delay circuit may be configured to form a ring oscillator stage and said operatively coupled second signal delay circuit may be configured to form a RC oscillator stage with said ring oscillator stage.

Advantageously, said first and second voltage response characteristic may be a supply voltage dependency of respective said predetermined first and second propagation delay.

BRIEF DESCRIPTION OF THE DRAWINGS

Preferred embodiments of the present invention will now be described, by way of example only and not in any limitative sense, with reference to the accompanying drawings, in which.

DETAILED DESCRIPTION OF THE PREFERRED EMBODIMENT(S)

The exemplary embodiments of this invention will be described in relation to oscillator systems, and in particular to an oscillator comprising at least two operably coupled signal delay circuits having inversely correlated voltage response characteristics. However, it is understood by a person skilled in the art that any number and type of suitable signal delay stages may be used provided that the sum of all voltage characteristics cancels out, or at least minimises, any frequency variation for variations in the supply voltage.

As is known in the field, an RC oscillator's frequency is (approximately) inversely proportional to the supply voltage. On the other hand, a ring oscillator's frequency is proportional to supply voltage. The improved oscillator of the present invention is a hybrid oscillator that combines the characteristics of a ring oscillator stage with the characteristics of an RC oscillator stage. In particular, the oscillator of the present invention is a combination of a ring oscillator stage in series with an RC oscillator stage.

Figure 4:
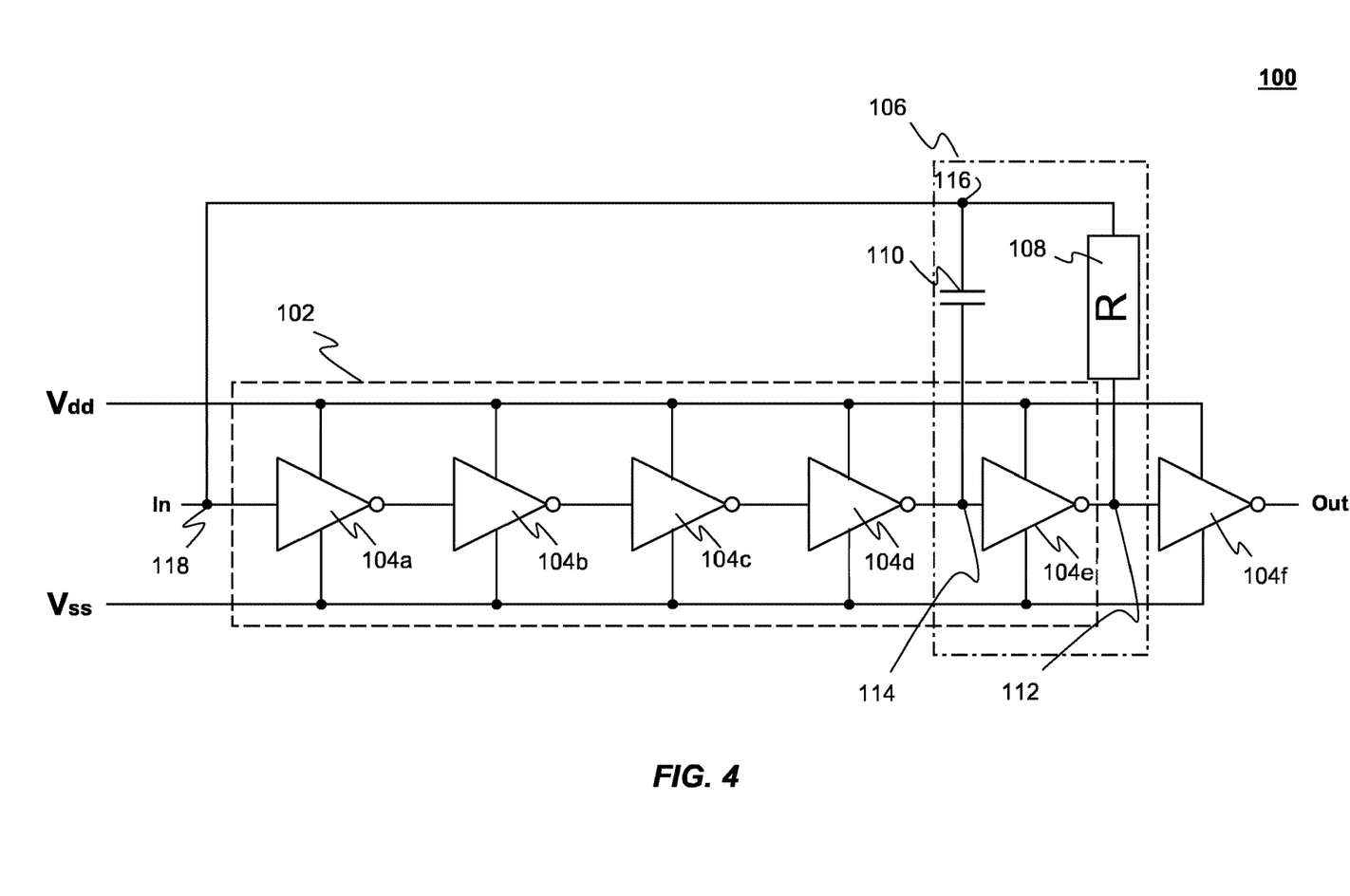
FIG. 4 shows a simplified schematic illustration of a circuit diagram of an embodiment of the oscillator of the present invention, using five inverter stages coupled with an RC network, and a buffer inverter stage.

FIG. 4 shows a simplified circuit diagram of an example embodiment of an oscillator of the present invention. Here, the ring oscillator stage 102 features a number of inverters 104a, 104b, 104c, 104d and 104e in series. The RC oscillator stage 106 features one inverter 104e, with a resistance 108 and a capacitance 110 connected in series between the output 112 and the input 114 of inverter 104e. The junction 116 between the resistor 108 and the capacitance 110 is also connected to the input 118 of the ring oscillator stage 102. Although, capacitor 110 is shown connected to the input of the inverter 104e and the resistor 108 is connected to the output of the inverter 104e, their positions may also be reversed without deviating from the inventive concept of the hybrid oscillator.

Another inverter 104f may be coupled to the output 112 to provide an optional output buffer stage. In embodiments of the present invention the frequency of the ring oscillator stage 102 is approximately matched to the frequency of the RC oscillator stage 106.

Figure 5:
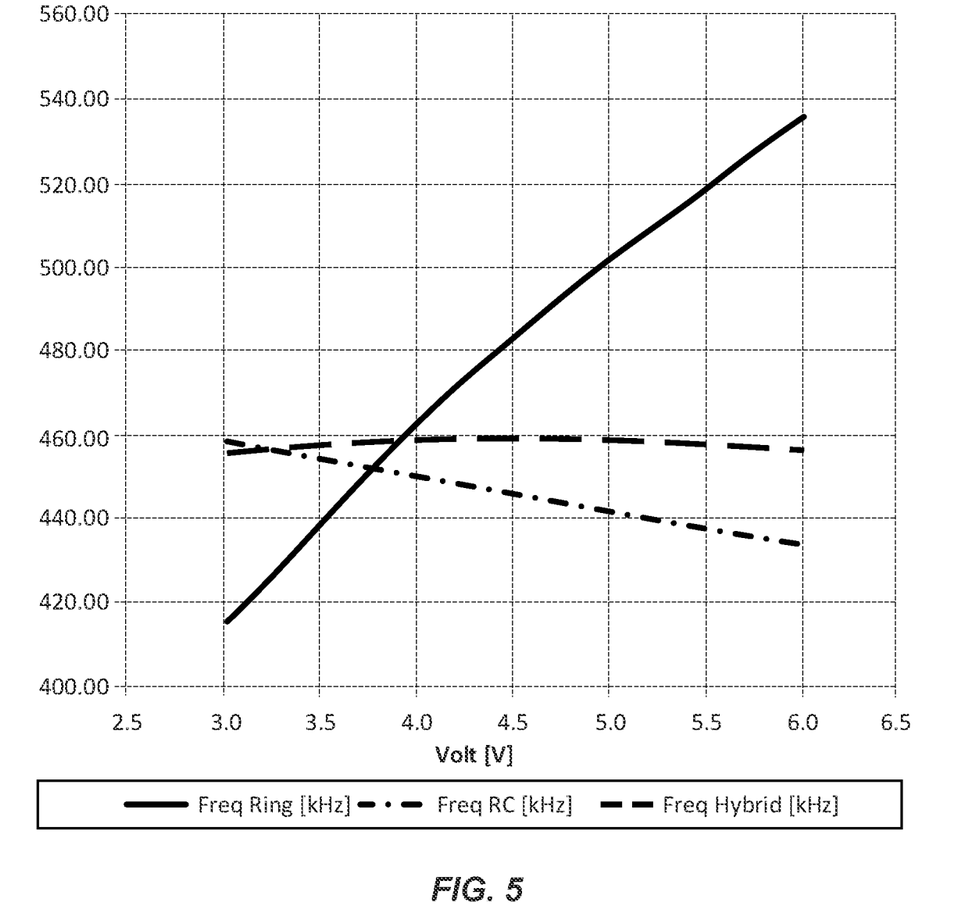
FIG. 5 shows an example plot comparing frequency variations over a specific supply voltage range for a typical RC oscillator, a typical ring oscillator and the improved oscillator of the present invention.

FIG. 5 shows simulated results (dashed line) from the hybrid oscillator 100 of the present invention, as well as, those from an RC oscillator (continuous line) and a ring oscillator (dash-dot line) for comparison. The plot shows the variation in oscillator frequency (vertical axis) over a range of supply voltage (horizontal axis).

In this particular simulation, all three oscillators were specified for the same nominal frequency of 450 kHz at a supply voltage $V_{dd}-V_{ss}$ of 4.5 V. The comparison clearly shows that the hybrid oscillator frequency variation is significantly less over the range of supply voltage than either one of the ring oscillator or the RC oscillator.

Figure 6:
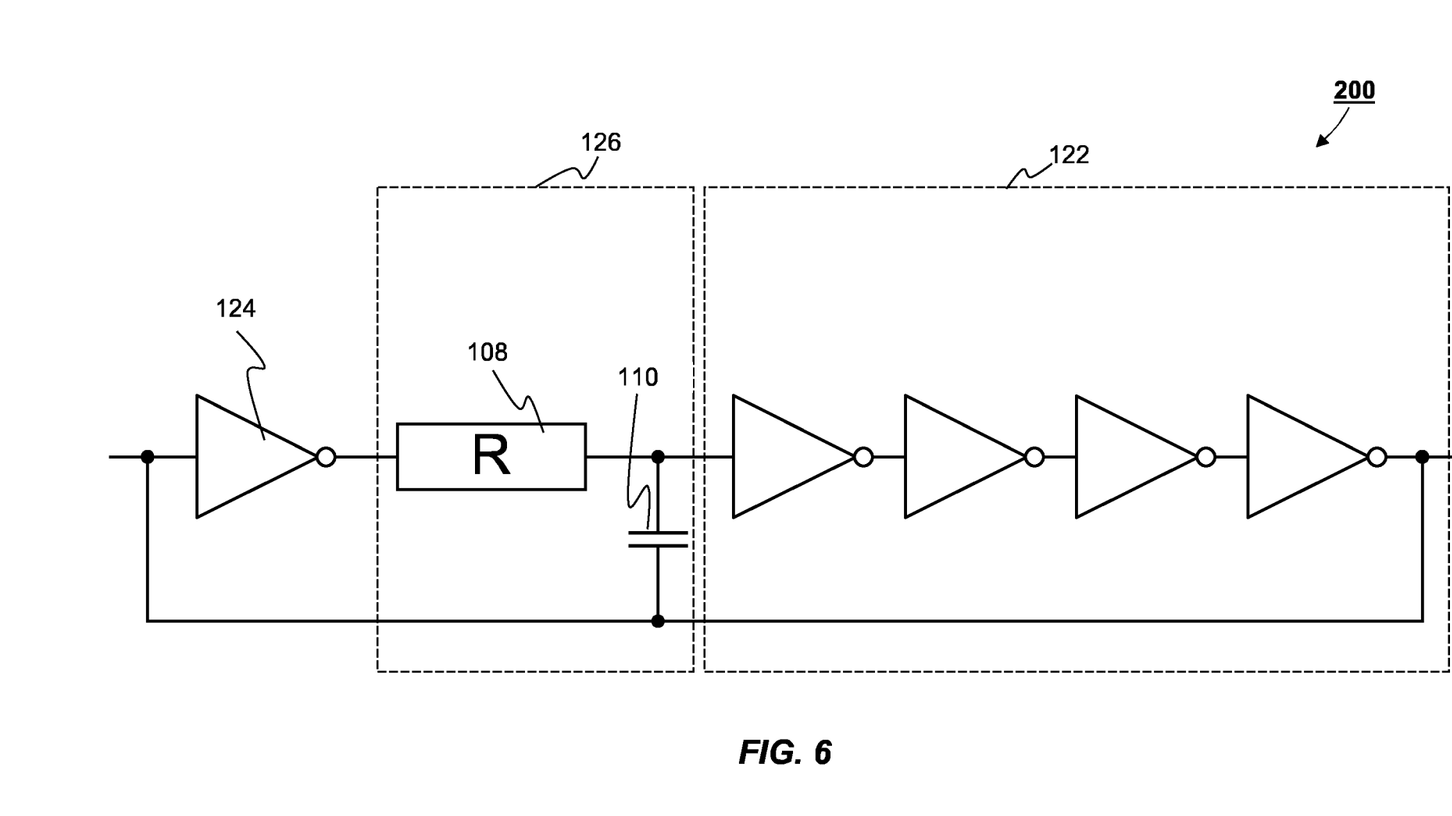
FIG. 6 shows simplified schematic illustration of an alternative circuit diagram of an embodiment of the oscillator of the present invention, using five inverter stages coupled with an RC network, but without a buffer inverter stage.

FIG. 6 is an alternative embodiment 200 to embodiment 100 shown in FIG. 4, containing the same components as the circuit diagram shown in FIG. 4, but without the buffer stage 104f. An inverter delay circuit is formed from five inverters in series, i.e. inverters 122 and 124, these five inverters being arranged around resistor 108 and capacitor 110 so as to make the RC delay circuit 126 oscillate. It is instructive to consider the operation of this circuit in the time domain, rather than in the frequency domain. The cycle delay through all five inverters 124 and 122 of the inverter delay circuit needs to be approximately matched to the time constant of the RC delay circuit 126.

The number of inverter stages and the inverter specifications/characteristics (i.e. load resistances, transistor impedances, etc.) in the ring oscillator 102 or inverter delay circuit 122 and 124, and the resistor 108 and capacitor 110 components and inverter specifications/characteristics in the RC oscillator 106 or RC delay circuit 126 may be chosen so as to optimise oscillator performance (i.e. frequency stability, oscillating accuracy) over a desired range of the supply voltage (i.e. $V_{dd}-V_{ss}$) and a desired frequency range.

Alternatively, the ring oscillator stage 102 and the RC oscillator stage 106 may each be separately optimised for a frequency range that is centred on a frequency that is double the desired centre frequency of the hybrid oscillator 100. In another alternative embodiment, the inverter delay circuit 122 and 124 and the RC delay circuit 126 may each be separately optimised for a delay range that is centred on a delay that is one half (i.e. ½) of the desired overall cycle delay of the hybrid oscillator 200.

Figure 7:
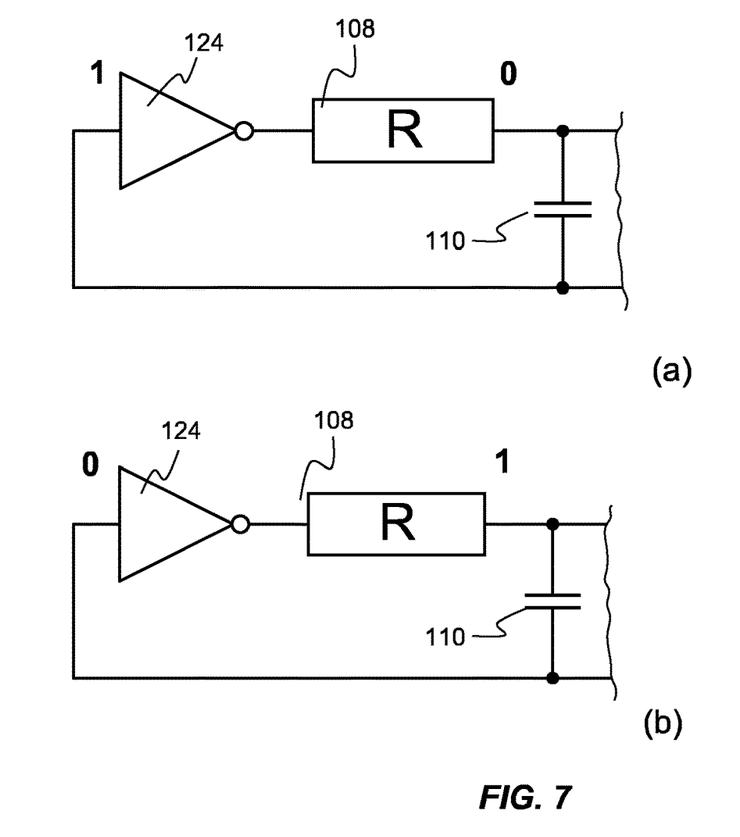
FIG. 7 shows a simplified schematic of the hybrid oscillator of the present invention, as well as, snap-shots of logic states at different moment in time, i.e. (a) stage 1 and (b) stage 2, during operation.

FIGS. 7(a) and (b) illustrate the simplified RC oscillator operation within the hybrid oscillator, (a) showing logic states at each one of the components of the hybrid oscillator are shown as logic '1' or logic '0' at a first time, and (b) showing the logic states at a subsequent clock cycle.

The delay time depends on the charging/discharging of the RC element 108, 110, and, as is known in the art, is dominated by the discharge time. Therefore, the overall RC stage delay time increases as the supply voltage is increased.

Figure 8:
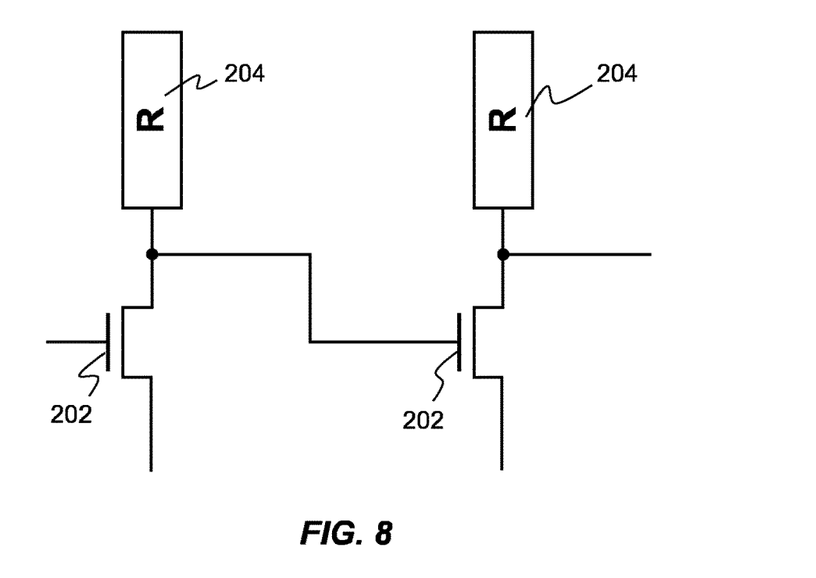
FIG. 8 shows a more detailed section of transistor/resistor configuration for the ring oscillator operation.

FIG. 8 illustrates the ring oscillator operation within the hybrid oscillator, represented by a unipolar inverter stage comprising transistors 202 (of the same type) and resistors 204.

Here, the delay time depends on the charging/discharging of the gate capacitance of the transistor 202, and, as is known in the art, decreases in both charge and discharge cycles with increases in supply voltage. Hence the overall ring oscillator stage delay time decreases as the supply voltage increases.

When the ring oscillator stage delay time is approximately matched to that of the RC oscillator stage, this has the effect of substantially cancelling out the supply voltage-dependence characteristics of the RC oscillator shown above.

It will be appreciated by persons skilled in the art that the above embodiment(s) have been described by way of example only and not in any limitative sense, and that various alterations and modifications are possible without departing from the scope of the invention as defined by the appended claims.

The invention claimed is:

1. An oscillator, having an input terminal, and an output terminal providing an oscillating output signal of a predetermined frequency comprising:
    a ring oscillator stage, having a first supply voltage response characteristic, configured to provide a predetermined first propagation delay depending on a supply voltage;
    an RC oscillator stage, having a second supply voltage response characteristic that is inversely correlated to said first supply voltage response characteristic, operatively coupled with said ring oscillator stage and configured to provide a predetermined second propagation delay depending on said supply voltage, and
    wherein said predetermined first propagation delay of said ring oscillator stage and said predetermined second propagation delay of said RC oscillator stage are each approximately one half of a period of said oscillating output signal of a predetermined frequency, so as to generate said oscillating output signal of a predetermined frequency and stabilise said frequency of said oscillating output signal to variations of a predetermined voltage range of said supply voltage.

2. An oscillator according to claim 1, wherein said supply voltage is provided via a first supply rail for providing a first supply voltage and a second supply rail for providing a second supply voltage.

3. An oscillator according to claim 2, wherein said ring oscillator stage comprises at least two series-coupled inverter stages between said input terminal and said output terminal, each operatively coupled to said first and second supply rail.

4. An oscillator according to claim 3, wherein said RC oscillator stage comprises at least one resistor-capacitor (RC) network operatively coupled with said at least two series-coupled inverter stages of said ring oscillator stage.

5. An oscillator according to claim 1, further comprising a buffer stage operatively coupled to said output terminal and adapted to provide a predetermined impedance characteristic.

6. An oscillator according to claim 3, wherein said ring oscillator stage comprises an odd number of series-coupled inverter stages.

7. An oscillator according to claim 3, wherein said ring oscillator stage is in series with said RC oscillator stage.

8. An oscillator according to claim 1, wherein said first and second voltage response characteristic is a supply voltage dependency of respective said predetermined first and second propagation delay.

* * * * *